US006897664B1

United States Patent
Bruce et al.

(10) Patent No.: US 6,897,664 B1
(45) Date of Patent: May 24, 2005

(54) LASER BEAM INDUCED PHENOMENA DETECTION

(75) Inventors: Michael Bruce, Austin, TX (US); Gregory A. Dabney, Austin, TX (US); Palaniappan Muthupalaniappan, Singapore (SG); Jiann Min Chin, Singapore (SG); Richard Jacob Wilcox, Austin, TX (US); Glen Gilfeather, Del Valle, TX (US); Brennan Davis, Austin, TX (US); Jacob Phang, Singapore (SG); Choon Meng Chua, Singapore (SG); Lian Ser Koh, Singapore (SG); Hoo-Yin Ng, Singapore (SG); Soon Huat Tan, Singapore (SG)

(73) Assignees: Advanced Micro Devices, Inc., Sunnyvale, CA (US); Semicaps Pte Ltd., Singapore (SG)

( * ) Notice: Subject to any disclaimer, the term of this patent is extended or adjusted under 35 U.S.C. 154(b) by 114 days.

(21) Appl. No.: 10/261,390

(22) Filed: Sep. 30, 2002

(51) Int. Cl.$^7$ .............................................. G01R 31/305
(52) U.S. Cl. ...................................... 324/751; 324/752
(58) Field of Search .............................. 324/753, 158.1, 324/765, 752, 750, 751; 250/559.07, 309

(56) References Cited

U.S. PATENT DOCUMENTS

| 6,078,183 | A | * | 6/2000 | Cole, Jr. ...................... 324/752 |
| 6,407,560 | B1 | * | 6/2002 | Walraven et al. ........... 324/752 |
| 6,617,862 | B1 | * | 9/2003 | Bruce .......................... 324/752 |

OTHER PUBLICATIONS

Edward I. Cole, Jr. et al.; *Backside Localization of Open and Shorted IC Interconnections*, IEEE; Jun. 19, 1998; pp. all.
R. Aaron Falk; *Advanced LIVA/TIVA Techniques*; Proceedings from the 27th International Symposium for Testing and Failure Analysis; Nov. 11–15, 2001; pp. all.

Muthu Palaniappan et al.; *New Signal Detection Methods for Thermal Beam Induced Phenomenon*; Proceedings from the 27th International Symposium for Testing and Failure Analysis; Nov. 11–15, 2001; pp. 171–177.

OptoMetrix, Inc.; Technology News Letter Q2, 2001; Q2 2001; pp. all.

OptoMetrix, Inc.; Technology News Letter Q4, 2001; Q4 2001; pp. all.

OptoMetrix, Inc.; *Laser Scanning Microscope–Laser Scanning Fundamentals*; http://www.optomet.com/scanfund.htm; Sep. 2002; pp. 1–3.

* cited by examiner

*Primary Examiner*—Kamand Cuneo
*Assistant Examiner*—Tung X. Nguyen
(74) *Attorney, Agent, or Firm*—Timothy M. Honeycutt

(57) ABSTRACT

Apparatus for and methods of inspection using laser beam induced alteration are provided. In one aspect, an apparatus is provided that includes a laser scanning microscope for directing a laser beam at a circuit structure and a source for biasing and thereby establishing a power condition in the circuit structure. A detection circuit is provided for detecting a change in the power condition in response to illumination of the circuit structure by the laser beam and generating a first output signal based on the detected change. A signal processor is provided for processing the first output signal and generating a second output signal based thereon. A control system is operable to scan the laser beam according to a pattern that has a plurality of pixel locations, whereby the laser beam may be moved to a given pixel location and allowed to dwell there for a selected time before being moved to another pixel location.

22 Claims, 2 Drawing Sheets

LASER BEAM INDUCED PHENOMENA DETECTION

BACKGROUND OF THE INVENTION

1. Field of the Invention

This invention relates generally to semiconductor processing, and more particularly to apparatus for laser beam induced phenomena inspection of integrated circuits and to methods of using the same.

2. Description of the Related Art

Fault-isolation techniques are critical to the development and manufacture of large-scale integrated circuits such as microprocessors. Examples of such techniques include those methodologies which exploit thermal beam induced phenomena such as Thermally Induced Voltage Alteration ("TIVA"), Seebeck Effect Imaging ("SEI") and Infrared Laser Optical Beam Induced Resistance Change ("IR-OBIRCH"). These techniques are often effective in localizing electrical opens and shorts that can be significant manufacturing concerns.

TIVA and SEI utilize a scanning infrared laser to isolate a defect within a die by thermally altering the defect's electrical characteristics. The basic setup uses a constant current source for biasing the device under inspection ("DUT") and detects the change in the voltage demand due to the localized heating by the laser. This technique requires the use of time constant delay to amplify the change in voltage for effective detection. However, integrated circuits, such as microprocessors, require high current biasing that is often beyond the specification limits of commercially available current sources. In addition, biasing in the constant current mode may not turn on all the operation modes of certain mixed signal integrated circuits.

Like TIVA and SEI techniques, IR-OBIRCH maps the infrared laser position to changes in the I–V characteristics of the device under inspection which result from localized laser heating of a defect. In this case, a constant voltage source is implemented for biasing and the resultant change in current is monitored Although IR-OBIRCH avoids the technical issues associated with using a constant current source, the sensitivity may be less than that provided by TIVA. Moreover, the detection of current change is difficult to implement in general.

Another drawback associated with conventional thermal beam inspection techniques is the potential for a discontinuity to exist between the length of time that the incident laser beam strikes a given pixel and the response time of the signal detection circuitry. Most conventional laser scanning microscopes scan the laser beam continuously across a frame. Each pixel is momentarily illuminated for a time period that is fixed by the frame size, e.g., 512×512 and the scan rate, e.g., 5.0 seconds/frame. If the illumination time per pixel is less than the response time of the signal detection circuitry, then the sensed signal will tend to smear into adjacent pixels and produce a characteristic tail pattern that can obscure the behavior of adjacent structures.

The present invention is directed to overcoming or reducing the effects of one or more of the foregoing disadvantages.

SUMMARY OF THE INVENTION

In accordance with another aspect of the present invention, an apparatus is provided that includes a laser scanning microscope for directing a laser beam at a circuit structure and a source for biasing and thereby establishing a power condition in the circuit structure. The source has a voltage source and a series-connected inductor. The series-connected inductor is operable to slow the responsiveness of the source to chances in the power condition of the circuit structure. A detection circuit is provided for detecting a change in the power condition in response to illumination of the circuit structure by the laser beam and generating a first output signal based on the detected change. A signal processor is provided for processing the first output signal and generating a second output signal based thereon. A control system is operable to scan the laser beam according to a pattern that has a plurality of pixel locations.

In accordance with another aspect of the present invention, an apparatus is provided that includes a laser scanning microscope for directing a laser beam at a circuit structure, a pulser for selectively directing the laser beam in a series of pulses and a source for biasing and thereby establishing a power condition in the circuit structure. A detection circuit is provided for detecting a change in the power condition in response to illumination of the circuit structure by the laser beam and generating a first output signal based on the detected change. A lock-in amplifier is included for processing the first output signal and generating a second output signal based thereon. A signal generator is coupled to the pulser and the lock-in amplifier for generating a reference frequency used by both for synchronization. A control system is operable to scan the laser beam according to a pattern that has a plurality of pixel locations, whereby the laser beam may be moved to a given pixel location and allowed to dwell there for a selected time before being moved to another pixel location.

In accordance with another aspect of the present invention, a method of processing is provided that includes directing a laser beam to dwell on a first location of a circuit structure for a preselected dwell time and applying a bias and thereby establishing a power condition in the circuit structure. The bias is applied using a voltage source and a series-connected inductor. The series-connected inductor is operable to slow the responsiveness of the voltage source to changes in the power condition of the circuit structure. A change in the power condition in response to illumination of the first location of the circuit structure by the laser beam is detected and a first output signal is generated based on the detected change. The laser beans is then directed to dwell on a second location of the circuit structure.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
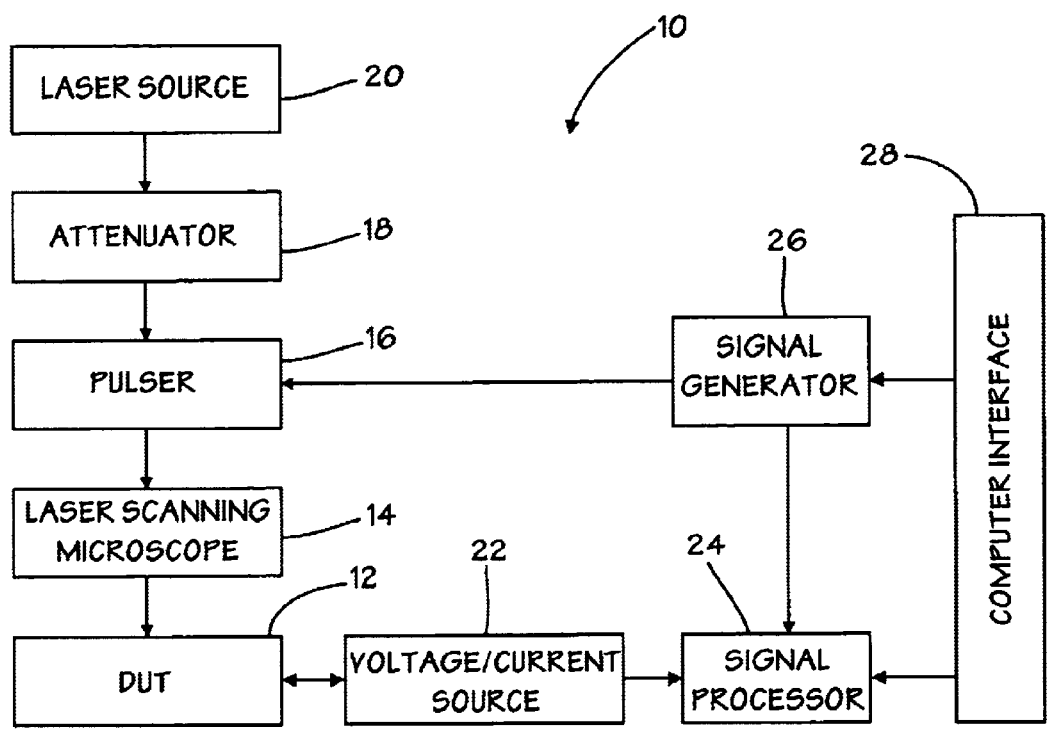
FIG. 1 is a block diagram of an exemplary embodiment of an inspection system in accordance with the present invention

In the drawings described below, reference numerals are generally repeated where identical elements appear in more than one figure. Turning now to the drawings, and in particular to FIG. 1, therein is shown a block diagram of an exemplary embodiment of an inspection system 10 in accordance with the present invention. The inspection system 10 is designed to image a device under test ("DUT") 12 by means of laser induced techniques. The DUT 12 may be any of a myriad of integrated circuit devices, such as, for example, diodes, transistors, capacitors, local interconnects, or the like. The system 10 includes a laser scanning microscope ("LSM") 14, a pulser 16, an attenuator 18 and a laser source 20. A voltage/current source and detection circuit 22 ("detection circuit 22") is provided to bias the DUT 12. A signal processor 24 is provided to acquire signals from the voltage/current source 22. A signal generator 26 may be provided to synchronize the pulser 16 with the voltage/current source 22 and signal processor 24 in order control pixel dwell time as described more fully below. The entire system 10 may be controlled through a fully integrated computer system and software interface 28.

The laser scanning microscope 14 may be a Semicaps, Ltd. Model SOM 1005 or other suitable instrument. The SOM 1005 is an integrated multi-laser near infrared scanning optical microscope system that is capable of use in Optical Beam Induced Currents ("OIC"), Single Contact Optical Beam Induced Currents ("SCOBIC") TIVA, SEI, OBIRCH, Laser Induced Voltage Alteration ("LIVA"), and other related techniques. The laser scanning microscope 14 uses a Ge diode photo-detector to produce the reflected images. Typical image raster scan rates of 1.6 to 12 seconds per frame may be used for a 512 by 512 pixel image resolution. Other frame sizes and scan rates may be used as desired. A motorized turret with five objectives and an accurate tri-axis motorized stage is used for focusing and accurate positioning of the device under test DUT 12.

The laser source 20 is selected to provide incident radiation at a wavelength appropriate for the materials undergoing inspection. In an exemplary embodiment, the laser source 20 is a 1340 nm Nd: YV04. At this wavelength, localized heating through backside silicon is possible. This is desirable where flip chip silicon is imaged.

The voltage/current source/detection circuit 22 applies a bias to the DUT 12 and measures the response induced by the beam from the laser source 20. In an exemplary embodiment suitable for TIVA detection, a Keithley Model 2420 source measurement unit may be used in a constant current mode. For IR-OBIRCH, a Hewlett Packard E3614A voltage source may be used to provide the constant voltage source. As described more fully below, the detection circuit 22 may be modified in accordance with the present invention in order to improve performance.

The signal processor 24 receives and amplifies signals from the detection circuit 22. To this end, the signal processor 24 is provided with an amplifier to amplify the input signals. The amplifier may be implemented as an AC-coupled mode amplifier, such as an Ithaca Model 1201. However, in order to increase the sensitivity and signal-to-noise ratio of the collected voltage transient, the amplifier may be implemented as a lock-in amplifier. To operate the amplifier in a lock-in mode, the laser pulser 16 directs the laser radiation as a series of pulses. The pulser 16 is operable to receive clock pulses from the signal generator 26 and commands from the control system 28 in order to send a selected number of laser pulses to the DUT 12. The output clock signal from the signal generator 16 is also fed to the lock-in amplifier of the signal processor 24. The output of the lock-in amplifier is fed into an image acquisition system that may be part of the control system 28 or part of the LSM 14 or both. Laser beam induced images are then constructed by making the image brightness level be proportional to the output voltage of the signal processor 24. Thus, the pixel intensity is proportional to the integrated transient signal.

The laser pulser 16 may be implemented as a beam chopper, such as a chopper wheel. Other well-known pulsing techniques may be used. The available pulse frequencies are largely matters of design discretion. In an exemplary embodiment, the pulse frequency may be about 1 to 4 kHz.

The dwell time at a given pixel or location of the DUT 12 may be controlled. This is desirable in order to ensure that the detection circuit 22 and the signal processor have adequate time to make at least one sample at the pixel before the laser beam is moved to the next pixel. The dwell time control is implemented by turning the pulser 16 to an "off" position or setting so that no radiation is transmitted to the DUT 12. The LSM 14 is next instructed by the control system 28 to move to the laser beam to a selected pixel. At this point, control system 28 commands the pulser 16 to deliver a selected number of pulses to the DUT 12 and the detection circuit 22 and the signal processor to make one or more voltage variation samples at the given pixel. The clock signal from the signal generator 26 is used to synchronize the laser pulse delivery and data acquisition. The samples are then converted to images by the control system 28. The conversion to imagery may be coincident with signal acquisition or time delayed as desired.

When the selected number of clock cycles and thus laser pulses is propagated, the pulser 16 turns off and the laser beam is directed to the next pixel to be scanned. The process is then repeated.

The range of the pixel dwell time is selectable between some minimum and maximum. The minimum dwell time is limited largely by the response time of the piezoelectric scanners within the laser scan module of the LSM 14. The maximum dwell time is limited largely by throughput considerations. It should be understood that the dwell time at a given pixel may be defined in terms of clock cycles or through some other parameter. For example, the dwell time at a given pixel may be selected to correspond to a preferred number of test cycles. A typical test cycle will include laser illumination followed by power condition response and data acquisition. After the selected number of test cycles is completed, the control system 28 will direct the beam to the next pixel, and so on.

The laser attenuator 18 is designed to attenuate the power of the incident laser beam. This may be desirable in order to tailor the laser power to the capabilities of the amplifier in the signal processor 24.

The implementation of dwell time control can alleviate the tail phenomenon associated with conventional laser beam induced alternation inspection techniques, particularly in TIVA. To illustrate the improvement, a magnified plan of a small portion of an integrated circuit 30 is shown view in FIG. 2. The integrated circuit 30 is formed on a silicon substrate 32 mounted in a flip-chip orientation, although front-side imaging is envisioned as well. If backside imaging is used, backside polishing or grinding may be necessary to improve image quality. The portion of the integrated circuit 30 illustrated includes a diode 34 tied to a device gate 36 of an NMOS device 37 by an interconnect structure 38.

An anti-reflective coating (not shown) may be applied to maximize the transmitted intensity of the laser light through the silicon backside. It should be understood that the integrated circuit 30 could be implemented on a myriad of substrate materials and with a myriad of circuit structures.

Figure 2:
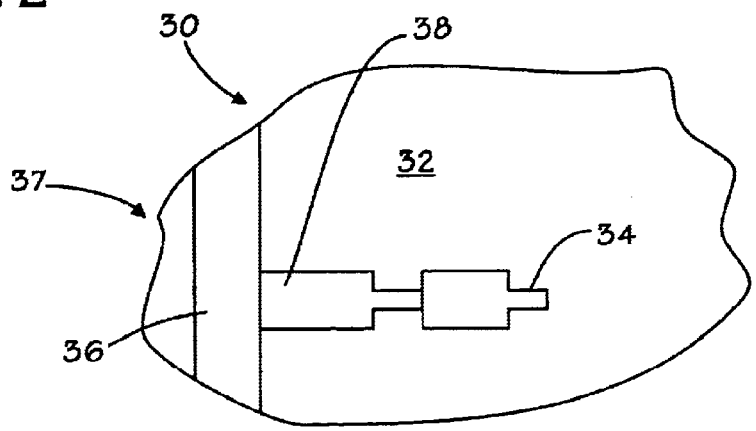
FIG. 2 is a magnified plan of a small portion of the backside of an integrated circuit undergoing inspection in accordance with the present invention.
Figure 3:
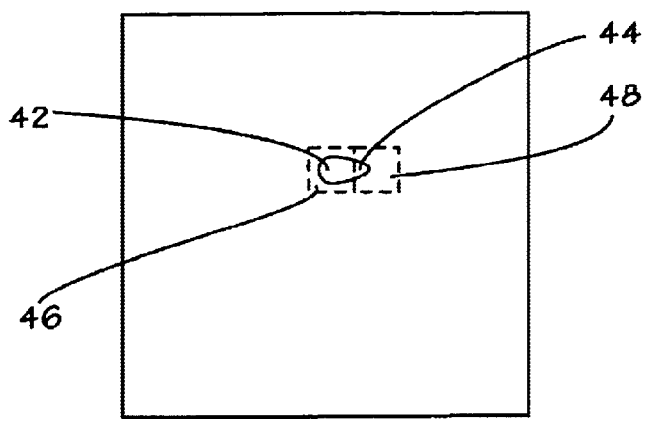
FIG. 3 is a typical conventionally produced thermal beam induced alteration image of the portion of the integrated circuit.
Figure 4:
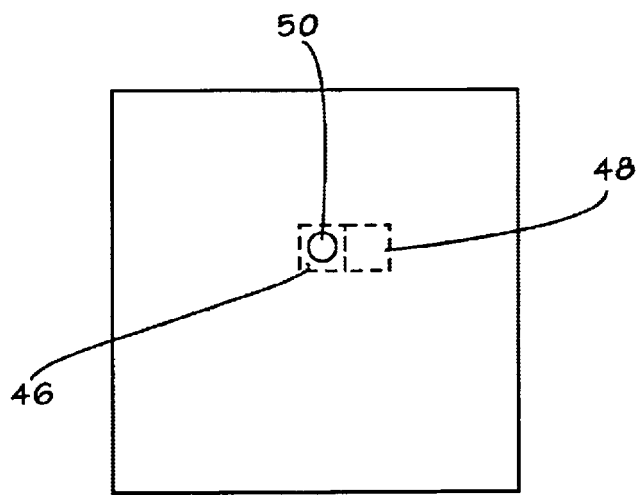
FIG. 4 is a laser beam induced alteration image of the portion of the integrated circuit generated in accordance with the present invention.

A comparison of a typical TIVA image of the diode 34 depicted in FIG. 2 produced by conventional scan control and a typical TIVA image produced by the system 10 (See FIG. 1) in accordance with the present invention is shown in FIGS. 3 and 4. As shown in FIG. 4, the TIVA image 42 produced by the conventional scheme includes a distortion or tail 44 that bleeds from one pixel 46 to an adjacent pixel 48. However, the TIVA image 50 produced in using dwell time control in accordance with the present invention exhibits a crisper shape without bleeding over to adjacent pixels.

Figure 5:
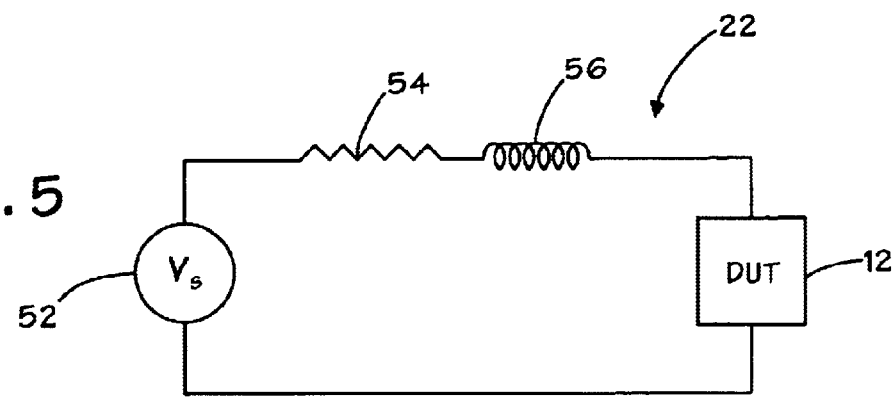
FIG. 5 is a schematic diagram of an exemplary embodiment of a source for biasing the integrated circuit in accordance with the present invention.

The detection circuit 22 may be provided with an improvement that enhances signal detection. As shown in FIG. 5, the detection circuit 22 includes a voltage source 52 that is coupled to the DUT 12. The intrinsic resistance of the voltage source 52 is represented by the series-connected resistor 54. This resistance is normally negligible. In this illustrative embodiment, one or more inductors 56 are tied in series with the voltage source 52 and the DUT 12. The inductor(s) 56 slow changes in current.

When a scanning laser beam irradiates an integrated circuit with a short circuit, the localized heating changes the resistance of the short and thereby changes the IC power demand. In the example of the diode 34 shown in FIG. 2, the change in demand would correspond to a change in the power demand of the diode 34 due to laser excitation, which would result in a voltage change across the NMOS device 37 since the inductor would be effective in restricting instantaneous changes in current. An analysis of the effect of this detection circuit 22 is theoretically described below.

The change in the power demand dP across the diode 36 shown in FIG. 2 is provided in the following equations:

$$\frac{dP}{dt} = \frac{d(VI)}{dt} \qquad \text{Equation 1}$$

$$\frac{dP}{dt} = \frac{IdV}{dt} + \frac{VdI}{dt} \qquad \text{Equation 2}$$

$$i(t) = \left(\frac{V_S}{R} \div \left(I_0 + \frac{V_S}{R}\right)\right) \times e^{(-tR/L)} \qquad \text{Equation 3}$$

Where i(t) is the current at time t, V, is voltage across the DUT 12, R is the resistance of the DUT 12, $I_0$ is the initial current, i.e., before the TIVA changes the DUT resistance and L is the inductance of the inductor(s) 56. The current i(t) is inversely proportional to the inductance L. Thus, for a large value of inductance L, the following approximation becomes appropriate.

$$\frac{dI}{dt} \approx 0 \qquad \text{Equation 4}$$

Therefore $$\frac{dP}{dt} = I\frac{dV}{dt} \qquad \text{Equation 5}$$

By incorporating a series-connected inductor(s) 56 into the bias scheme, variations in power demand are reflected proportionally as changes in the voltage across the diode 36. The overall effect is similar to use of a constant current source as in the case of the conventional TIVA methodology.

Experiments were performed on the detection circuit 22 using various values of inductance. A sub-micron process was used to form the NMOS device 37 on a silicon substrate 32. The backside of the substrate 32 was polished to a thickness of 100 μm+/−5.0 μm and an anti-reflective coating was applied. The detection circuit 22 was tried with 1.3 mH, 2.7 mH and 5.4 mH series inductors, respectively. Images from the new configuration at the various inductance values were better defined with features that were not observable using a traditional TIVA setup. It was also noted that as the inductance value was increased, the detection circuit 22 more closely approximated a constant current mode of the conventional TIVA setup.

The skilled artisan will appreciate that the integrated circuit 30 may undergo further processing as necessary following inspection. The types of additional processing steps are legion, and include, for example, etching, metallization, cleaning, masking, film deposition and other inspections to name just a few.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. An apparatus, comprising
    a laser scanning microscope for directing a laser beam at a circuit structure;
    a source for biasing and thereby establishing a power condition in the circuit structure, the source having a voltage source and a series-connected inductor, the series-connected inductor being operable to slow the responsiveness of the source to changes in the power condition of the circuit structure;
    a detection circuit for detecting a change in the power condition in response to illumination of the circuit structure by the laser beam and generating a first output signal based on the detected change;
    a signal processor for processing the first output signal and generating a second output signal based thereon; and
    a control system operable to scan the laser beam according to a pattern having a plurality of pixel locations.

2. The apparatus of claim 1, wherein the control system is operable to move the laser beam to a given pixel location and allow the laser beam to dwell there for a selected time before being moved to another pixel location.

3. The apparatus of claim 1, wherein the detection circuit is operable to detect a change in power condition that comprises a change in voltage.

4. The apparatus of claim 1, wherein the detection circuit is operable to detect a change in power condition comprising a chance in current.

5. The apparatus of claim 1, wherein the signal processor comprises a lock-in amplifier.

6. The apparatus of claim 1, wherein the signal processor comprises an AC-coupled amplifier.

7. The apparatus of claim 1, comprising a plurality of inductors series-connected to the voltage source.

8. The apparatus of claim 1, comprising a pulser for selectively directing the laser beam in a series of pulses.

9. The apparatus of claim 8, wherein the pulser comprises an optical chopper.

10. An apparatus, comprising:
a laser scanning microscope for directing a laser beam at a circuit structure;
a pulser for selectively directing the laser beam in a series of pulses;
a source for biasing and a series-connected inductor, the series-connected inductor being operable to slow the responsiveness of the source to changes in the power condition of the circuit structure;
a detection circuit for detecting a change in the power condition in response to illumination of the circuit structure by the laser beam and generating a first output signal based on the detected change;
a lock-in amplifier for processing the first output signal and generating a second output signal based thereon;
a signal generator coupled to the pulser and the lock-in amplifier for generating a reference frequency used by both for synchronization; and
a control system operable to scan the laser beam according to a pattern having a plurality of pixel locations, whereby the laser beam may be moved to a given pixel location and allowed to dwell there for a selected time before being moved to another pixel location.

11. The apparatus of claim 10, wherein the detection circuit is operable to detect a change in power condition that comprises a change in voltage.

12. The apparatus of claim 10, wherein the detection circuit is operable to detect a change in power condition comprising a change in current.

13. A method of processing, comprising:
directing a laser beam to dwell on a first location of a circuit structure for a preselected dwell time;
applying a bias and thereby stabilizing a power condition in the circuit structure; using a voltage source and a series-connected inductor, the series-connected inductor being operable to slow the responsiveness of the voltage source to changes in the power condition of the circuit structure;
detecting a change in the power condition in response to illumination of the first location of the circuit structure by the laser beam and generating a first output signal based on the detected change; and
directing the laser beam to dwell on a second location of the circuit structure.

14. The method of claim 13, comprising generating a first image of the first location based on the first output signal.

15. The method of claim 13, comprising again applying a bias and thereby establishing a power condition in the circuit structure and detecting a change in the power condition in response to illumination of the second location of the circuit structure by the laser beam and generating a second output signal based on the detected change.

16. The method of claim 15, comprising generating a second image of the first location based on the second output signal.

17. The method of claim 13, wherein the detection of a change in power condition comprises detection in a change in voltage.

18. The method of claim 13, wherein the detection of a change in power condition comprises detection in a change in current.

19. The method of claim 13, wherein the first output signal is generated by a lock-in amplifier.

20. The method of claim 13, wherein the first output signal is generated by an AC-coupled amplifier.

21. The method of claim 13, wherein the laser beam comprises a series of pulses.

22. The method of claim 13, comprising performing another processing step on the circuit structure after directing the laser beam and generating the first output signal.

* * * * *

UNITED STATES PATENT AND TRADEMARK OFFICE
CERTIFICATE OF CORRECTION

PATENT NO. : 6,897,664 B1
DATED : May 24, 2005
INVENTOR(S) : Michael Bruce et al.

It is certified that error appears in the above-identified patent and that said Letters Patent is hereby corrected as shown below:

Column 2,
Line 5, delete "chances" and substitute -- changes -- therefor;
Line 46, delete "beans" and substitute -- beam -- therefor;

Column 5,
Line 43, delete "÷" and substitute -- + -- therefor;

Column 6,
Line 57, delete "chance" and substitute -- change -- therefor; and

Column 7,
Line 36, delete ";".

Signed and Sealed this

Nineteenth Day of July, 2005

JON W. DUDAS
*Director of the United States Patent and Trademark Office*